United States Patent [19]

Kondratyev et al.

[11] Patent Number: 5,646,584
[45] Date of Patent: Jul. 8, 1997

[54] SAW FILTER INCLUDING ELECTRODES OF OPPOSING POLARITY

[75] Inventors: Sergei N. Kondratyev, Neuchatel, Switzerland; Victor P. Plessky, Geneveys Sur Coffrane, Switzerland; Clinton S. Hartmann, Dallas, Tex.; Thor Thorvaldsson, Bevaix, Switzerland; David P. Morgan, Northampton, United Kingdom

[73] Assignee: Advanced SAW Products SA, Bevaix, Switzerland

[21] Appl. No.: 427,344

[22] Filed: Apr. 24, 1995

[30] Foreign Application Priority Data

Apr. 25, 1994 [GB] United Kingdom ............... 9408181
Apr. 25, 1994 [GB] United Kingdom ............... 9408188
Sep. 21, 1994 [GB] United Kingdom ............... 9418975

[51] Int. Cl.$^6$ ........................................ H03H 9/00
[52] U.S. Cl. .................. 333/193; 333/195; 310/313 R; 310/313 D
[58] Field of Search .................. 333/193–196; 310/313 R, 313 B, 313 C, 313 D

[56] References Cited

U.S. PATENT DOCUMENTS

| | | | |
|---|---|---|---|
| 4,079,342 | 3/1978 | Solie. | |
| 4,353,043 | 10/1982 | Gunton | 333/151 |
| 4,591,815 | 5/1986 | Schofield | 333/195 |
| 4,609,891 | 9/1986 | Solie et al. | 333/195 |
| 4,679,014 | 7/1987 | Bulst et al. | 333/195 |
| 5,128,640 | 7/1992 | Anemogiannis | 333/193 |
| 5,296,824 | 3/1994 | Cho et al. | 333/195 |
| 5,357,228 | 10/1994 | Dufilie | 333/195 |
| 5,365,206 | 11/1994 | Machui et al. | 333/195 |
| 5,379,010 | 1/1995 | Ruile et al. | 333/195 |

FOREIGN PATENT DOCUMENTS

| | | |
|---|---|---|
| 59-51615 | 3/1984 | Japan. |
| 1554366 | 10/1979 | United Kingdom. |
| 2117992 | 10/1983 | United Kingdom. |
| WO90/03690 | 4/1990 | WIPO. |
| WO93/08641 | 4/1993 | WIPO. |
| WO93/13595 | 7/1993 | WIPO. |

*Primary Examiner*—Benny Lee
*Assistant Examiner*—Darius Gambino
*Attorney, Agent, or Firm*—Perman & Green

[57] ABSTRACT

A SAW filter having an even number of tracks, each track comprising reflective input and output IDTs having a partially reflecting grating disposed between them. One of the IDTs of each pair of tracks has its electrodes connected in opposite polarity to those of the other IDTs of the pair of tracks and the separation of the input and output IDTs of respective tracks of each pair of tracks is substantially the same. The relative dispositions of the partially reflecting gratings are such that waves launched into respective tracks of a pair of tracks undergo at least one reflection from the partially reflecting grating prior to being coherently incident on the output IDTs. By virtue of the oppositely connected electrodes of one of the IDTs, direct coupling through the tracks is inhibited at substantially all frequencies.

20 Claims, 2 Drawing Sheets

TRACK 1:

PATH LENGTHS 1
2  $L_{11} + 3L_{12}$
3
4  $3L_{11} + L_{12}$

TRACK 2:

5
6  $\lambda/2 + L_{21} + 3L_{22}$
7
8  $\lambda/2 + 3L_{21} + L_{22}$

SAW FILTER INCLUDING ELECTRODES OF OPPOSING POLARITY

FIELD OF INVENTION

This invention relates to a Surface Acoustic Wave (SAW) filter. In particular, it relates to a SAW filter comprising a plurality of tracks.

BACKGROUND OF INVENTION

SAW technology has found a number of applications in the electronics and RF art. Due to the fact that SAW wavelengths are typically $10^5$ times shorter than that of electromagnetic waves having a corresponding frequency, SAW technology has found particular applications where miniaturisation is important or desirable. One such application is the use of SAW filters in radio telephones where the typically small size and weight of SAW filters is highly advantageous over conventional technologies, such as ceramic filters, dielectric filters, and filters using magnetostatic waves. Generally, it is a requirement of such SAW filters that they have low-loss, typically insertion losses of 1~3 dB for RF use, although for IF filters somewhat higher insertion loss of 5~13 dB could be acceptable. Additionally, it is desirable that SAW filters have a good shape factor and high suppression levels in the stopband.

A typical example of a conventional SAW filter is a SAW filter in which SAW energy is transferred between two spaced apart interdigital transducers (IDTs). The IDTs comprise two sets of equally spaced metal strips (electrode fingers), which are formed on the surface of a piezoelectric substrate. The electrode fingers in each set are typically electrically coupled together by bus-bars and are interleaved (interdigitated) with the electrode fingers of the other set. This arrangement can generate SAWs in both directions transverse to each electrode finger when a high frequency electrical signal is applied between the sets of electrode fingers, and it can also generate an electrical voltage when SAWs are incident on the electrode fingers. These processes are most efficient when the frequency of the SAWs is such that the periodicity of the electrode fingers in each set is close to or the same as the SAW wavelength, or some multiple of this frequency. In the simplest form of IDT, the spacing between adjacent electrode fingers of a set of electrode fingers is one SAW centre wavelength, i.e. one electrode finger per period in each set of electrodes. Thus there are two electrode fingers per period taking into account both sets of electrode fingers. The conventional terms in the art for such arrangements are "two electrodes per period" or "two electrodes per wavelength". However, it is possible to have more than one finger per SAW wavelength (period).

A particular path for a surface acoustic wave comprising SAW elements such as IDTs and/or reflection gratings is known as a track.

For conventional filters, to a first order the lengths of the transducers substantially determine the bandwidth of the filter since BW $\alpha$ 1/L where L is the length of the transducers. Thus, the more narrow the bandwidth requirement the longer the transducers need to be. Increasing the length of transducers to decrease the bandwidth of the filter mitigates against advantages of small size usually associated with SAW devices. In particular, there has recently been a requirement for narrow-band filters for portable apparatus, and it is desirable to be able to provide such narrow-band devices without any increase in the size of the components and preferably with a decrease in the size of the components relative to conventional components and known SAW devices.

A known SAW filter device is described in a paper entitled "A New Compact SAW Low Loss Filter for Mobile Radio" presented at the seventh European Frequency and Time Forum held at Neuchâtel, Switzerland 16–18 Mar. 1993 and is disclosed in International Patent Application WO 93/08641. In this known device there are two tracks each having an input and output Single Phase Uni-Directional Transducer (SPUDT) separated by a reflection grating. The difference in direct path lengths between the input and output SPUDTs for respective tracks is half a SAW wavelength ($\lambda/2$). The two input SPUDTs are electrically coupled together in parallel and the two output SPUDTs are electrically coupled together in parallel. Due to the half wavelength difference in separation, voltages generated at respective output SPUDTs by directly coupled SAWs launched by respective input SPUDTs are $\pi$ out of phase at the centre frequency and cancel each other and thus no output voltage is generated across the output SPUDTs. By a complex arrangement of partial reflections from reflection gratings disposed in respective tracks, SAWs in respective tracks undergoing such reflections are coherently incident at respective output SPUDTs and the individual voltages generated by each SPUDT add in phase to provide an output. By virtue of the reflected paths for the SAWs the length of the impulse response for the input and output SPUDTs is effectively lengthened. Thus, a device having a particular bandwidth may be fitted into a smaller space than previously possible. Alternatively, a device having a narrower bandwidth than before may fit into the same space. However, the known device has some drawbacks. Exact cancellation of the directly coupled surface acoustic waves only occurs at the designed centre frequency ($f_o$) of the device. At frequencies outside of this centre frequency $f_o$ the suppression in the stopband is progressively reduced as the frequency progressively deviates from the centre frequency $f_o$. The suppression can be as poor as 10 dB at a 20% deviation from the centre frequency $f_o$ of the device. Thus, the frequency selectivity of the device is impaired. Additionally, parasitic signals such as bulk wave signals are only cancelled at the centre frequency. Furthermore, other parasitic signals such as electromagnetic or capacitative coupling between respective input and output IDTs are not compensated by the known device.

BRIEF SUMMARY OF INVENTION

According to the present invention, there is provided a SAW filter comprising an even number N of tracks, each track including an input interdigitated transducer (IDT) spaced apart from an output IDT, a partially reflecting means disposed between the input and output IDTs and reflecting means respectively associated with the input and output IDTs, wherein electrodes of one IDT of a pair of tracks are connectable in opposite polarity relative to electrodes of other IDTs of the pair of tracks, in each pair of tracks the input and output IDTs of respective tracks are separated by substantially the same amount, and surface acoustic waves launched into respective tracks from the input IDTs undergo at least one reflection from the partially reflecting means prior to forming a substantially coherent signal at the output IDTs.

This has the advantage that surfaces acoustic waves which are directly coupled from the input IDTs to the output IDTs and parasitic bulkwaves are suppressed for substantially all frequencies of operation of the device, Furthermore, electromagnetic feed through and capacitative coupling between the input and output IDTs can be suppressed, as can the effect of reflections from the sides of the substrate supporting the SAW filter.

Additionally, the greater the number of tracks N that are used the better the side lobe rejection that can be achieved since the greater the number of reflections from the IDTs and the reflection means.

Thus, a SAW filter in accordance with the present invention has increased stopband suppression and a decrease in ripple in the passband.

In a preferred embodiment an effective electro-acoustic separation between the partially reflecting means and an IDT of each track of a pair of tracks differ by an odd integer multiple of an acoustic wavelength corresponding to an operating frequency of the SAW filter divided by twice the number of tracks N.

Typically, the operating frequency of the SAW filter will be the centre frequency $f_o$ of the SAW transducers.

In a preferred embodiment of the invention, the transmission coefficient of the partially reflecting means is $-3$ dB. Utilising such an embodiment means that insertion loss of the SAW filter may be minimised.

Advantageously, the input IDTs and/or the output IDTs may be coupled together in series. This has the advantage that the SAW filter can provide differential input and output drives and is particularly suited for balanced drives.

Optionally, the IDTs may comprise a single electrode of each polarity per period (single electrode IDT) or Single Phase Uni-Directional Transducers (SPUDTs). These have the advantage that the reflecting means respectively associated with the input and output IDTs are formed by the IDTs themselves when the surface acoustic waves incident on respective input or output IDTs are out of phase and are mutually suppressed. This is due to the fact that there is no transduction signal from the IDTs and hence the IDTs appear as if they are short circuit, and thus the single-electrode IDTs or SPUDTs reflect the incident surface acoustic waves in accordance with their well known usual characteristics. Thus, there is no need for reflecting means which are separate from the IDTs.

The use of SPUDTs is particularly advantageous since they can be well matched to an output load for when the incident surface acoustic waves are coherent, and thus reflections are reduced and output signals due to subsequent reflections will be low.

In a SAW filter having multiple electrodes per period IDTs such as SPUDTs, at least one IDT may comprise additional split electrodes, which improves the frequency selectivity of the SAW filter by increasing the length of the impulse response of the IDT.

Any gaps between the reflection gratings and IDTs may be filled with additional split-electrode gratings, each electrode having a width of $\lambda_o/8$ and the gratings have a period of $\lambda_o/4$. Such split-electrode gratings act to decrease diffraction losses from the tracks.

Preferably, the partially reflecting means is a conductive grating, which facilitates production of the SAW filter since the grating can be formed of the same conductive material as the IDTs and thus at the same time.

Particularly, the conductive grating may be earthed which improves the suppression of feed through signals and further serves to isolate the output IDTs from direct signals from the input IDTs.

Generally, the reflection coefficient per wavelength of the partially reflecting means or, K, grating satisfies $1 \leq MK \leq 8$, where M is the length of the grating in wavelengths, and in particular $1.4 \leq MK \leq 2.0$ which results in a good shape factor for the SAW filter.

The reflection grating has its reflection coefficient R and transmission coefficient T dependent on frequency, but the energy of the wave is just shared between the reflected and the transmitted wave. To have minimal losses it is advantageous to get $|R|^2=|T|^2=\frac{1}{2}$. When the reflectivity is increased the condition $|R|^2=\frac{1}{2}$ is first met at the centre frequency, but if the increase is continued this condition is fulfilled at two frequencies at respective edges of the stopband. This results in an improvement to the shape-factor of the filter characteristic.

There may be provided additional reflecting means between the input and output IDTs and the edges of a substrate supporting the SAW filter which helps reduce losses from the device.

Suitably, the IDTs or grating may comprise high density metals such as gold or platinum to increase the reflectivity per individual electrode or strip and hence the size of the device may be reduced.

The types of surface wave utilised in the SAW filter are not restricted to Rayleigh waves but may include Surface Skimming Bulk Waves (SSBWs), leaky waves or Surface Transverse Waves (STWs).

Figure 1:
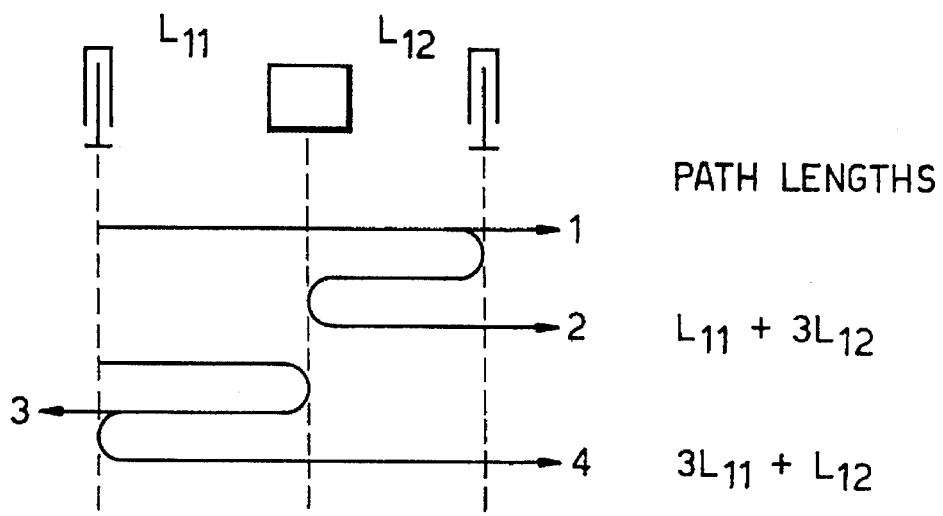
FIG. 1 shows a schematic of the acoustic paths through a device in accordance with the invention.
Figure 1:
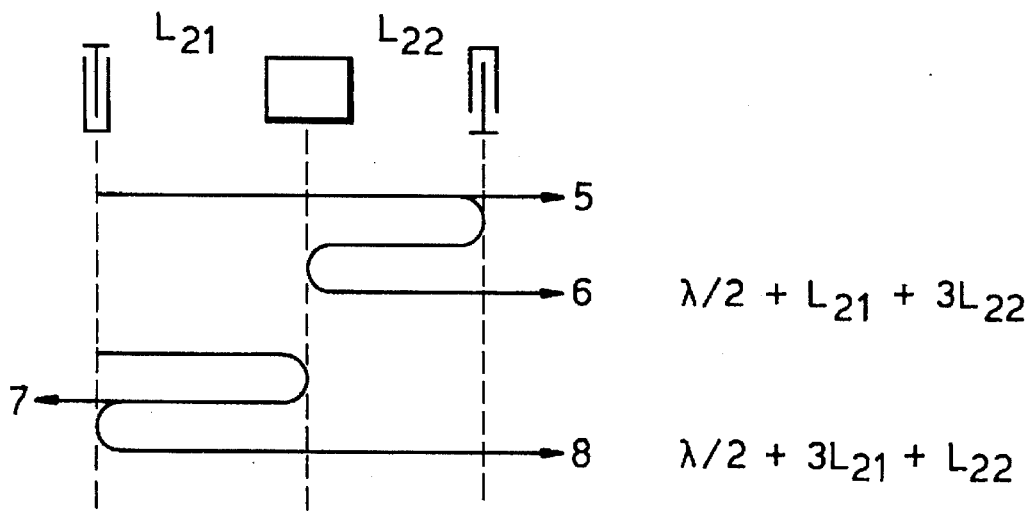

A general description of the invention follows with the aid of FIG. 1.

DETAILED DESCRIPTION OF EMBODIMENTS OF THE INVENTION

Specific embodiments of the invention will now be described, by way of example only, and with reference to the accompanying drawings.

In FIG. 1, the transducer separations are taken to be the same in both tracks, i.e.

$$L_{11}+L_{12}=L_{21}+L_{22} \quad (1)$$

The first-transit signals (1 and 5) cancel at all frequencies because the left transducer in track 2 is reversed. To account for this reversal $\lambda_o/2$ is added to the path lengths in track 2 (valid only at the centre frequency).

For preference the separations are such that the output signal is maximised. The waves involved (2, 4, 6, 8) all have the same amplitude because they each involve one reflection and one transmission by the gratings. So to maximise the amplitude they should all have the same phase, i.e. the same path length or differing by multiples of $\lambda_o$. For directional transducers, this also ensures that the acoustic reflection is small when the transducers are matched.

For track 1 outputs (2, 4) the difference in path lengths is $2L_{22}-2L_{21}$, so we need $$L_{12}-L_{11}=n\lambda/2 \text{ (n=any integer)} \quad (2)$$

For track 2 outputs (6, 8) the difference of path lengths is $2L_{22}-2L_{21}$, so we need $$L_{22}-L_{21}=m\lambda/2 \text{ (m=any integer)} \quad (3)$$

To get all four outputs to be the same phase, the path lengths of 2 and 6 need to be the same, i.e.

$$L_{11}+3L_{12}=\lambda/2+L_{21}+3L_{22}+N\lambda \text{ (N=any integer)},$$

or:

$$3(L_{12}L_{22})+L_{11}-L_{21}=(N+\tfrac{1}{2})\lambda \tag{4}$$

From equation (1) $L_{12}-L_{22}=L_{21}-L_{11}$, so equation (4) becomes $$L_{21}-L_{11}=(\tfrac{1}{2}N+\tfrac{1}{4})\lambda \tag{5}$$

i.e. $L_{21}-L_{11}$ should be an odd multiple of $\lambda/4$. The same result can also be obtained from equations (1–3). From equation (1), $L_{12}-L_{22}=L_{21}-L_{11}$. From equations (2, 3), $$L_{21}-L_{11}+L_{12}-L_{22}=(n-m)\lambda/2,$$

giving $$L_{21}-L_{11}, =(n-m)\lambda/4 \tag{6}$$

Comparing with equation (5)

$$n-m=2N+1 \tag{7}$$

Equation (7) makes $L_{21}-L_{11}$ an odd multiple of $\lambda/4$ and n–m should be odd.

In summary, when the spacing between transducers is the same in both tracks (equation 1), the design only needs to satisfy equations (2), (3) and (7). More simply, equation (2) says that the grating in track 1 is displaced $n\lambda/4$ to the left, compared with the central location; equation (3) says that the grating in track 2 is displaced $m\lambda/4$ to the left.

For example, you can have n=0 so that the grating is centrally located in track 1. You can then have m=1, which means that the grating in track 2 is shifted $\lambda/4$ to the left. Or you could have m=0 and n=1, so that the grating is central in track 2 and shifted $\lambda/4$ in track 1.

n=0, m=1, (or vice versa) is the preferred option, which gives the widest possible passband. With n, m>0 the phase difference from the centre frequency $f_o$ for useful signals becomes greater as the frequency is shifted from $f_o$. This leads to a faster decay of the signal received at the output IDTs and results in a passband.

The limits by which n and m can vary is given by $$n, m \leq \frac{f_o}{2\Delta f} \tag{8}$$

where $\Delta f/f_o$ is the fractional passband of the filter.

Figure 2:
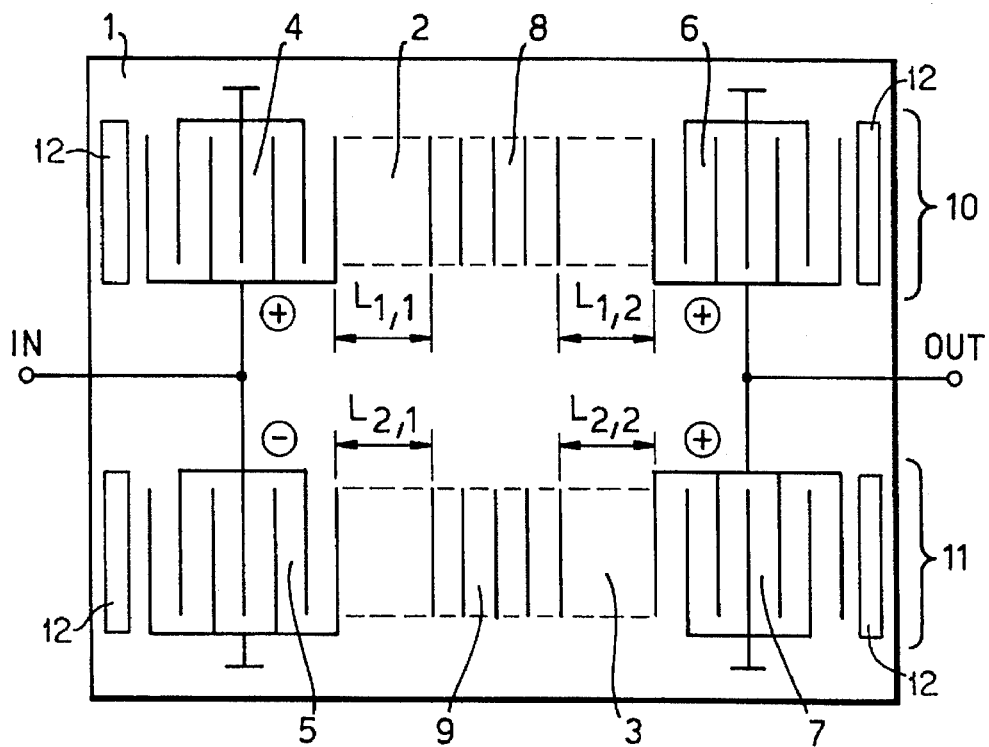
FIG. 2 shows a schematic diagram of a particular embodiment of the invention having two tracks.

FIG. 2 shows a SAW filter in accordance with an embodiment of the invention and having two tracks 10, 11 supported on piezoelectric substrate 1. Each track consists of an input IDT 4, 5 and an output IDT 6, 7, and has a reflection grating 8, 9 disposed between the input and output IDTs 4, 5, 6, 7. All the elements in each track are substantially collinear and the axis of respective tracks is in the same direction, although this is not essential. The distance between the IDTs in each track are the same and although both the input IDTs and both the output IDTs are shown in the same plane, again this is not essential. The separation of the reflection grating 8 from IDTs 4 and 6 in track 10 is respectively given by $L_{1,1}$ and $L_{1,2}$ and for grating 9 in track 11 the separation from IDTs 5 and 7 is respectively given by $L_{2,1}$ and $L_{2,2}$. For the two track device of FIG. 1 $L_{1,1}$ is different from $L_{1,2}$ by $\lambda_o/2$, where $\lambda_o$ is the acoustic wavelength corresponding to the centre frequency of the passband of the device, and correspondingly $L_{2,1}$ differs from $L_{2,2}$ by $\lambda_o/2$ also.

Preferably the tracks are placed such that their external sides are equi-distant from corresponding edges of the substrate. This helps inhibit spurious surface acoustic waves from input or output IDTs from reflecting from the edges and being incident on their corresponding output or input IDT.

In the SAW filter shown in FIG. 2 the electrodes or "fingers" of IDT 5 are connected to bus bars having opposite polarity compared with the electrodes of IDTs 4, 6, 7. That is to say, the electrodes of IDT 5 which are connected to earth are in positions in IDT 5 which correspond to the electrodes connected to the signal line in IDTs 4, 6, 7, and similarly the electrodes of IDT 5 connected to the signal line have positions corresponding to the electrodes connected to earth in IDTs 4, 6, 7. This reversal in polarity connection is indicated in FIG. 1 by use of the symbols $\ominus,\oplus$. Each IDT 4, 5, 6, 7 also has a reflector 12 associated therewith.

When a signal is input to the filter the phase of the surface acoustic waves generated by input IDT 4 are in anti-phase (differ by 180°) with the surface acoustic waves generated by input IDT 5 providing the feed lines are of equal electrical length. Surface acoustic waves which travel directly through respective gratings 8, 9 are in anti-phase with each other when incident on respective IDTs 6, 7. Thus, the voltages on each IDT 6, 7 formed by the transduced signals are also in anti-phase and cancel each other out. This results in the IDTs appearing as if they are short-circuited and in this embodiment which uses SPUDTs (and also for single electrode IDTs) the IDTs reflect the incident surface acoustic waves. For configurations in which the feed lines are such that they are not of equal electrical length the difference should be taken into account when designing the filter such that it can be compensated for. Therefore, directly coupled surface acoustic waves are suppressed. Similarly for parasitic bull waves generated by the IDTs, and reflections from the substrate edges.

Surface acoustic waves launched from the input IDTs 4, 5 and incident on the output IDTs 6, 7 via one grating reflection can travel by two possible paths. A surface acoustic wave launched from IDT 4 is reflected from grating 8 and a surface acoustic wave launched from IDT 5 is reflected from grating 9. Both reflected surface acoustic waves suffer a 3 dB loss due to the gratings being −3 dB partial reflectors. Since the surface acoustic waves launched from IDTs 4 and 5 are in anti-phase with each other and the distances $L_{1,1}$ and $L_{2,1}$ differ by $\lambda_o/4$ or odd multiples thereof, the surface acoustic waves incident on IDT 4 and IDT 5 after reflection from grating 8, 9 are in phase with each other. However, the electrodes of IDTs 4 and 5 are connected in opposite polarity to each other and thus the transduced voltages of IDTs 4 and 5 cancel and the IDTs appear as if they are short-circuited, and the incident surface acoustic waves are reflected. The surface acoustic waves reflected from IDTs 4, 5 then pass through gratings 8, 9 (suffering a 3 dB loss) and are incident in phase on the output IDTs 6, 7, and the transduced voltages add to give an output from the filter.

Alternatively, surface acoustic waves launched from IDTs 4, 5 pass through gratings 8, 9 (suffering a 3 dB loss) to be incident on IDTs 6, 7 in anti-phase with each other. As explained earlier, these surface acoustic waves will be reflected. The surface acoustic waves reflected from IDTs 6, 7 are reflected (suffering a 3 dB loss) from respective gratings 8, 9 to be incident once again on IDTs 6, 7. Due to the fact that distances $L_{1,2}$ and $L_{2,2}$ differ by $\lambda_o/4$ or odd multiples thereof, the surface acoustic waves reflected from gratings 8, 9 will be incident on IDTs 6, 7 in phase with each other. Thus, the transduced voltages will add to give an output from the filter.

Although the reflection gratings split the incident signals reflections and transmissions do not introduce overall losses into the device operation. In each path the loss is 6 dB, that is ½ of the amplitude of the signals, but both path signals are added in phase at the output IDTs 6, 7, i.e.

½+½=1, which gives 0 dB loss.

The energy either is reflected or transmitted by the centre grating but is not lost.

Both of the above described paths will be simultaneously possible for an input signal, since the gratings are −3 dB gratings. Surface acoustic waves which are reflected from the gratings more than once have a much reduced amplitude and consequently do not greatly affect the performance of the filter. Additionally, as mentioned earlier, this embodiment utilises SPUDTs and it is a well known feature of SPUDTs that they can be matched both electrically and acoustically. Thus, there are very low amplitude surface acoustic waves reflected from the SPUDTs after receiving coherent surface acoustic waves. Therefore, further reflections and spurious signals generated from the SPUDTs after coherent incidence of the surface acoustic waves are suppressed.

Figure 3:
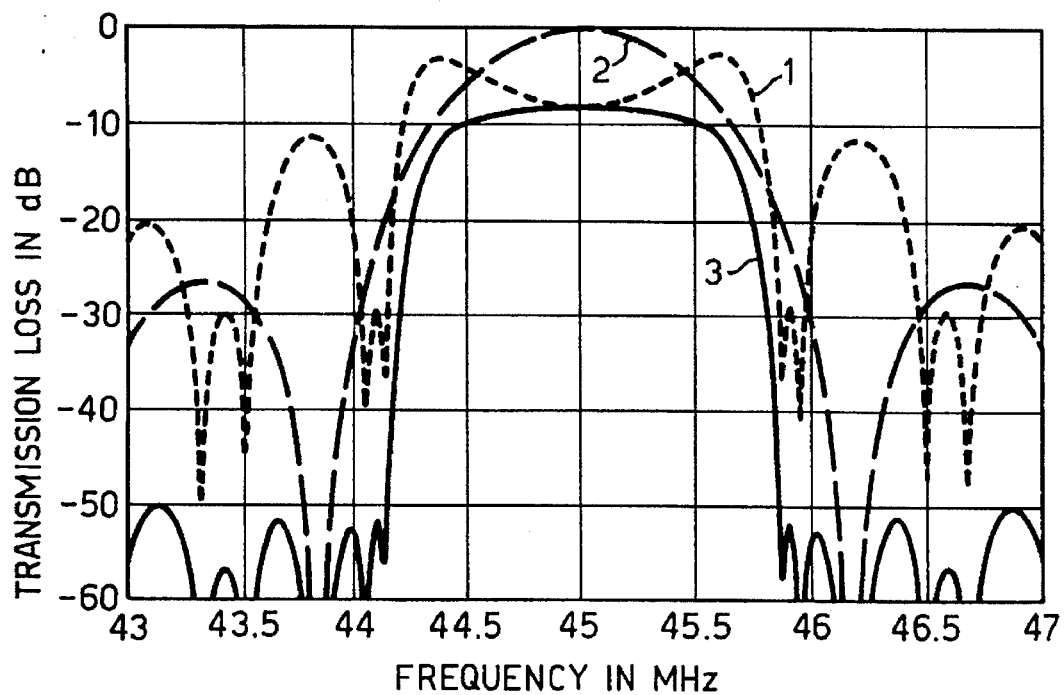
FIG. 3 shows the frequency response of an embodiment of the invention having two tracks.

The Applicant believes that the transfer characteristics of the filter are of the form:

$$F(f) \cong 2 * Tr(f)^2 * T(f) * R(f) * R_{SPUDT}(f)$$

where $Tr(f)$ is one SPUDT transduction, $T(f)$ is the transmission coefficient of the centre grating, $R(f)$ is the reflection coefficient of the same gratings and $R_{SPUDT}(f)$ is the reflection coefficient of a shorted SPUDT. FIG. 3 shows the details of how the transfer characteristic of the filter is formed. To achieve a good shape for the transfer characteristic which has a flat top and steep slopes, that the part of the transfer response formed by the grating, e.g.

$$F_{Gr(f)} \cong 2T(f) * R(f),$$

should have a concave form of passband (curve 1, FIG. 3) and the reflection coefficient of the grating should be relatively high. This concave form is compensated by the convex form of the IDTs' or SPUDTs' characteristics (curve 2, FIG. 3). The resulting filter characteristics (curve 3, FIG. 3) has a flat form in the passband and steep transitions from the passband to the stopband. Reflectivity per wavelength parameter K multiplied by the number of wavelength of the grating should be about 1.4 or higher to provide the concave form of $F_{Gr}(f)$, but this product should not exceed about 8 to avoid too high a loss from the filter and to get a flat passband without a minimum at its centre.

To achieve the necessary level of reflectivity of the gratings for a good shaped transfer characteristic the electrodes of the IDTs and/or gratings can be made of high density metals, (such as gold, platinum, etc). The increase in reflectivity allows the length of the gratings and IDTs to be reduced and thereby makes the filter smaller. To suppress unwanted signals in the stopband frequency range the IDTs can be appropriately weighted. To get narrower transduction characteristics the IDTs can incorporate non-reflecting split electrodes. Furthermore, it is possible to design a narrow transduction characteristic such that its null suppresses the first sidelobe of the transducer reflection characteristic, thereby reducing the sidelobes of the filter response. It should be noted that for particularly narrow band applications lower density metals should be used.

The fingers of the gratings 8, 9 can be used as a shield to suppress direct electromagnetic feedthrough by electrically interconnecting and grounding the fingers.

The transfer characteristics shown in FIG. 3 are for an IF filter designed in accordance with the present invention. The centre frequency is 45 MHz and the device has a −3 dB passband of 1.3 MHz. The substrate material is ST-quartz and is highly suitable because of its very good temperature stability: in the temperature range (−20, +80) ° C. the frequency shift is only about 5 KHz. Using $|R| \sim h/\lambda$, gold electrodes of the reflection grating having a thickness $h \approx 1.5$ μ, for $\lambda \approx 70$ μ, give a reflectivity of 3.5% per electrode which achieves the desired frequency characteristics with a minimum reflector length. Each of the reflection gratings has 64 electrodes. The transducers are of SPUDT type with an aperture of 15λ, and length of 39λ. The whole substrate size is about 10×3.5 mm². The insertion loss is less than 10 dB, and the stopband suppression is better than 40 dB. The −40 dB passband is 1.7 MHz, which indicate very steep skirts of the passband-to-stopband transition part of the frequency characteristic.

The foregoing description has been in respect of a two track device. However, it will be evident to the skilled person that more than two tracks can be utilised, e.g. four tracks. For four tracks, the distances $L_{2,1}$, $L_{3,1}$ and $L_{4,1}$ may respectively differ by $\lambda_o/8$, $\lambda_o/4$ and $3\lambda_o/8$ from $L_{1,1}$. In order for the direct signals to be suppressed at all frequencies it is necessary that pairs of tracks have their input and output IDTs separated by the same amount. For minimum losses in a four track device the grating reflection coefficient satisfies $$|R|^2 = \frac{x}{x+1}$$

where $x = 3 \pm 2\sqrt{2}$.

This gives a reflection coefficient of −8.3 dB or −0.7 dB.

A variety of configurations of the electrodes and bus bar connections can be used in various embodiments of the invention. For example, the input and/or output IDTs can be connected in series which permits differential or balanced input and/or output driving. Additionally, input or output IDTs in respective tracks having corresponding electrodes coupled to the same polarity may be combined such that they form a single IDT having electrodes which extend across respective tracks.

In view of the foregoing description it will be evident to a person skilled in the art that various modifications may be made within the scope of the invention. For example, the filter may be designed using non Rayleigh types of surface acoustic waves, such as SSBW, STW, leaky SAW and others. The choice of the type of the wave and a type of material of the substrate is determined by desired passband of the filter, temperature characteristics and other parameters well known to the skilled person.

What we claim is:

1. A SAW filter comprising an even number N of tracks, each track including an input interdigitated transducer (IDT) spaced apart from an output IDT, a partially reflecting means disposed between the input and output IDTs and reflecting means respectively associated with the input and output IDTs, wherein electrodes of one IDT of a pair of tracks are connectable in opposite polarity relative to electrodes of other IDTs of the pair of tracks, in each pair of tracks the input and output IDTs of respective tracks are separated by substantially the same amount, and surface acoustic waves launched into respective tracks from the input IDTs undergo at least one reflection from the partially reflecting means prior to forming a substantially coherent signal at the output IDTs.

2. A SAW filter according to claim 1, wherein an effective electro-acoustic separation between the partially reflecting means and an IDT of each track of a pair of tracks differ by an odd integer multiple an acoustic wavelength corresponding to an operating frequency of the SAW filter divided by twice the number of tracks N.

3. A SAW filter according to claim 1, wherein the operating frequency is the centre frequency $f_o$ of the IDTs.

4. A SAW filter according to claim 1, wherein the transmission coefficient of the partially reflecting means is −3 dB.

5. A SAW filter according to claim 1, wherein the input IDTs are coupled in series and the output IDTs are coupled in series.

6. A SAW filter according to claim 1, wherein the IDTs are Single Phase Uni-Directional Transducers SPUDTs and thereby form said reflecting means when the SPUDTs are short circuited.

7. A SAW filter according to claim 1, wherein at least one IDT comprises additional split electrodes.

8. A SAW filter according to claim 1, wherein the IDTs comprise a single electrode of each polarity per period and thereby form said reflecting means when the IDTs are short circuited.

9. A SAW filter according to claim 1, wherein the partially reflecting means is a conductive grating.

10. A SAW filter according to claim 7, wherein the conductive grating is adapted to be grounded.

11. A SAW filter according to claim 1, wherein the reflection coefficient per wavelength K of the partially reflecting means satisfies $1 \leq MK \leq 8$, where M is the length of the partially reflecting means in wavelengths.

12. A SAW filter according to claim 11, wherein the reflection coefficient per wavelength K of the partially reflecting means satisfies $1.4 \leq MK \leq 2.0$, where M is the length of the partially reflecting means in wavelengths.

13. A SAW filter according to claim 1, further comprising additional reflecting means between the input and output IDTs and the edges of a substrate supporting said SAW filter.

14. A SAW filter according to claim 1, wherein the reflecting means and/or IDTs comprise high density metals.

15. A SAW filter according to claim 1, wherein Surface Skimming Bulk Waves (SSBW), leaky waves or Surface Transverse Waves (STW) are utilised.

16. A SAW filter according to claim 1, having two tracks and wherein the difference in effective electro-acoustic separation of the partially reflecting means and an IDT of each track between the two tracks is an add number of quarter acoustic wavelengths.

17. A narrow bandwidth SAW filter comprising:

two tracks of input and output interdigitated transducers (IDT), spacing between the input and output IDTs of a first one of the tracks being the same as spacing between the input and output IDTs in a second one of the tracks, the IDTs in the second track being shifted relative to the IDTs in the first track, the IDTs each having respective reflecting means therewith, and one of the IDTs in the second track being connected in opposite polarity relative to a corresponding IDT in the first track; and means for partial reflection of surface acoustic waves, the partial reflection means being located between the input and output IDTs in each respective track;

wherein surface acoustic waves launched into the tracks from the input IDTs have portions that are reflected at least twice prior to the portions forming a substantially coherent signal at the output IDTs.

18. In a SAW filter having a plurality of tracks of input and output interdigitated transducers (IDT), two of the tracks having electrically connected input IDTs and electrically connected output IDTs with equal spacings in their respective tracks between the input and output IDTs, wherein the improvement comprises:

means, located in the two tracks, for partially reflecting surface acoustic waves, the reflecting means being located between the input and output IDTs in each of the two respective tracks and comprising reflection gratings.

19. A SAW filter as in claim 18 wherein spacing between input and output IDTs in each of the two respective tracks is the same and one of the two tracks is shifted relative to the other of the two tracks.

20. A SAW filter as in claim 19 wherein one of the IDTs in one of the two tracks is connected in opposite polarity relative to its corresponding IDT in the other of the two tracks.

* * * * *